United States Patent
Bass

(10) Patent No.: US 6,407,590 B2
(45) Date of Patent: Jun. 18, 2002

(54) HIGH FREQUENCY DIFFERENTIAL RECEIVER

(75) Inventor: Alan S. Bass, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/788,983

(22) Filed: Feb. 20, 2001

Related U.S. Application Data

(60) Provisional application No. 60/187,451, filed on Mar. 7, 2000.

(51) Int. Cl.[7] ................................................. G10R 19/00
(52) U.S. Cl. .......................................... 327/55; 327/52
(58) Field of Search ...................................... 327/52, 57

(56) References Cited

U.S. PATENT DOCUMENTS

| | | | | |
|---|---|---|---|---|
| 4,521,703 A | * | 6/1985 | Dingwall | 327/55 |
| 4,606,012 A | * | 8/1986 | Koshizuka | 327/55 |
| 4,616,148 A | * | 10/1986 | Ochii et al. | 327/55 |
| 5,977,798 A | * | 11/1999 | Zerbe | 327/55 |
| 6,147,514 A | * | 11/2000 | Shiratake | 327/55 |

* cited by examiner

*Primary Examiner*—Kenneth B. Wells
(74) *Attorney, Agent, or Firm*—Alan K. Stewart; Wade James Brady, III; Frederick J. Telecky, Jr.

(57) ABSTRACT

A differential receiver circuit includes: a current source 20; a differential pair 22 and 24 coupled to the current source 20; a first transistor 26 coupled to a first branch of the differential pair 22 and 24; a second transistor 28 coupled to a second branch of the differential pair 22 and 24, the first and second transistors 26 and 28 are cross coupled; a third transistor 54 coupled in series with the first transistor 26; a fourth transistor 56 coupled in series with the second transistor 28; a fifth transistor 30 coupled in parallel with the first and third transistors 26 and 54; and a sixth transistor 32 coupled in parallel with the second and fourth transistors 28 and 56.

4 Claims, 2 Drawing Sheets

HIGH FREQUENCY DIFFERENTIAL RECEIVER

This application claims priority under 35 USC §119 (e)(1) of provisional application number 60/187,451 filed Mar. 7, 2000.

FIELD OF THE INVENTION

This invention generally relates to electronic systems and in particular it relates to differential receivers.

BACKGROUND OF THE INVENTION

The input stage of a prior art small swing differential receiver has been implemented as shown in FIG. 1. The differential receiver of FIG. 1 contains three P-channel transistors 20, 22, and 24, and four N-channel transistors 26, 28, 30, and 32. Another circuit supplies the bias voltage to the gate of transistor 20. Then transistor 20 acts as a current source which is tied to a differential pair formed by transistors 22 and 24. When input node 34 is lower in voltage than input node 36, a majority of the current supplied by transistor 20 is steered through transistor 22, with the remainder of this current flowing through transistor 24. In order to insure that a large enough signal swing is generated at output nodes 38 and 40, cross-coupled transistors 26 and 28 are added, which gives this circuit additional gain. However, adding transistors 26 and 28 can cause the signal swing to become too large under some conditions, so clamp transistors 30 and 32 are added.

SUMMARY OF THE INVENTION

Generally, and in one form of the invention, the differential receiver circuit includes: a current source; a differential pair coupled to the current source; a first transistor coupled to a first branch of the differential pair; a second transistor coupled to a second branch of the differential pair, the first and second transistors are cross coupled; a third transistor coupled in series with the first transistor; a fourth transistor coupled in series with the second transistor; a fifth transistor coupled in parallel with the first and third transistors; and a sixth transistor coupled in parallel with the second and fourth transistors.

DETAILED DESCRIPTION OF PREFERRED EMBODIMENTS

Figure 1:
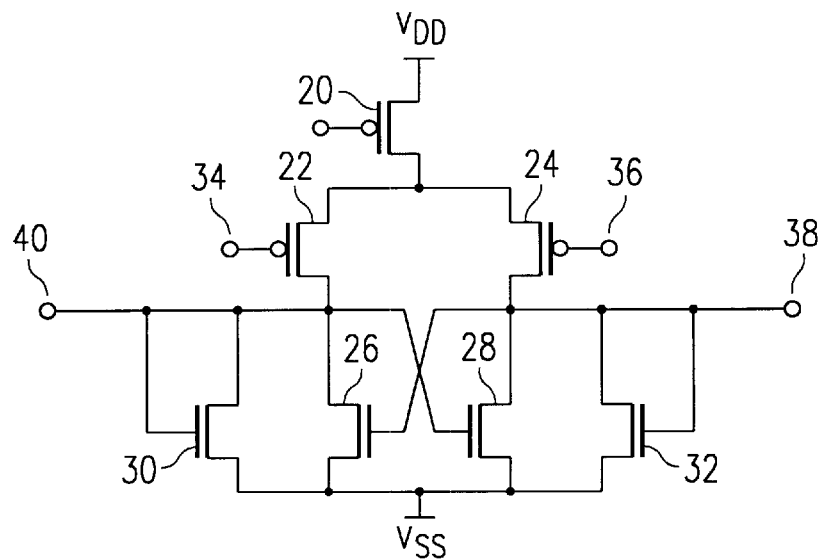
FIG. 1 is a schematic circuit diagram of prior art small swing differential receiver.
Figure 2:
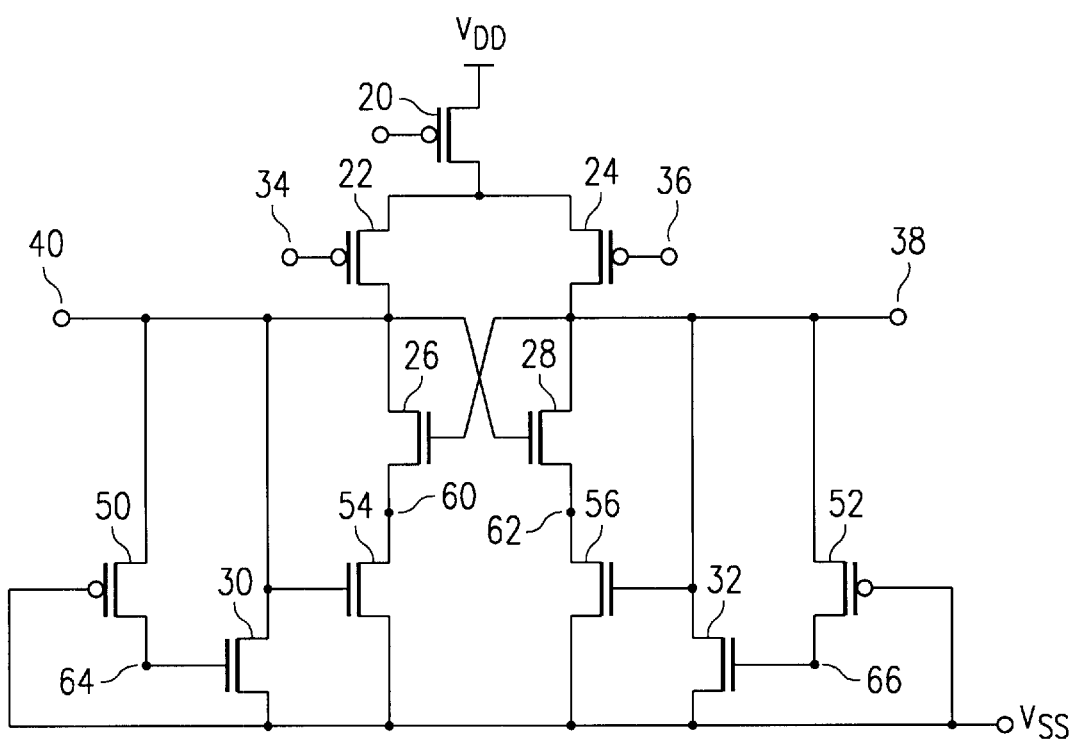
FIG. 2 is a schematic circuit diagram of a first preferred embodiment high frequency small swing differential receiver.

A first preferred embodiment differential receiver circuit is shown in FIG. 2. The input stage of the prior art differential receiver of FIG. 1 has been modified in the preferred embodiment circuit of FIG. 2 to allow higher frequency operation. The circuit of FIG. 2 includes P-channel transistors 20, 22, 24, 50, and 52; N-channel transistors 26, 28, 30, 32, 54, and 56; input nodes 34 and 36; output nodes 38 and 40; source voltages VDD and VSS. Capacitors may be added from nodes 60 and 62 to VSS.

Transistors 54 and 56 have been added to help speed up the turn-on of transistors 26 and 28. In the prior art circuit of FIG. 1, the gates of transistors 26 and 28 may pull down almost all the way to VSS. However, by inserting transistors 54 and 56, these gates can only pull down to within a threshold of VSS. As an example of how transistors 54 and 56 work, assume output node 38 is transitioning from low to high and output node 40 is transitioning from high to low. When node 40 gets to within a threshold voltage of VSS, transistor 54 shuts off. Output node 40 is pulled down with current flowing through transistors 26 and 54, but with transistor 54 turned off, no more current is available for pulling node 40 low. Therefore node 40 stays at a threshold voltage above VSS. In the prior art circuit of FIG. 1, output node 40 could pull down almost all the way to VSS. Then, on the low to high transition, since node 40 connects to the gate of transistor 28, transistor 28 will not begin to turn on until node 40 rises above VSS plus a threshold voltage. With the preferred embodiment circuit of FIG. 2, node 40 starts out at VSS plus a threshold voltage, so transistor 28 can turn on more quickly. This quicker turn-on allows the receiver to operate at higher frequencies. Similarly, output node 38 will only pull down to a threshold voltage above VSS because of the addition of transistor 56. Since node 38 connects to the gate of transistor 26, transistor 26 will turn on more quickly on the low to high transition.

Transistors 50 and 52 have been added to delay the turn-on and turn-off of clamp transistors 30 and 32, thereby speeding up the transitions on output nodes 38 and 40. As an example of how transistors 30 and 32 work, assume node 38 is switching from low to high and node 40 is switching from high to low. Transistor 50 adds an RC delay to node 64, and transistor 52 adds an RC delay to node 66. As node 38 rises, transistor 32 (clamp) turns on, which slows the rise of node 38. Inserting an RC delay on node 66 delays the turn-on of clamp 32, which allows node 38 to rise faster. As node 40 falls, transistor 50 delays the turn-off of transistor 30 (clamp), which helps node 40 to fall faster.

The RC delays on nodes 64 and 66 could be implemented by adding resistors in place of transistors 50 and 52. However, transistors are used because they help add voltage, temperature, and process compensation to the circuit. As voltage is decreased, the circuit tends to slow down. However, with less source to gate voltage across transistors 50 and 52, the effective resistance of transistors 50 and 52 increases, enhancing the speed-up effect on nodes 38 and 40. Similarly, as temperature increases, MOS transistors get weaker, slowing down the circuit. But the increased temperature makes 50 and 52 more resistive, enhancing the speed-up effect on nodes 38 and 40. Finally, with weaker processing the circuit gets slower, but the weaker processing makes transistors 50 and 52 more resistive, enhancing the speed-up effect on nodes 38 and 40. To achieve larger RC delays in the circuit of FIG. 2, transistors 50 and 52 can be replaced with two or more transistors in series. Capacitors can be added from nodes 60 and 62 to VSS to allow larger transient current to be pulled through transistors 26 and 28, which helps pull down nodes 38 and 40 more quickly.

Figure 3:
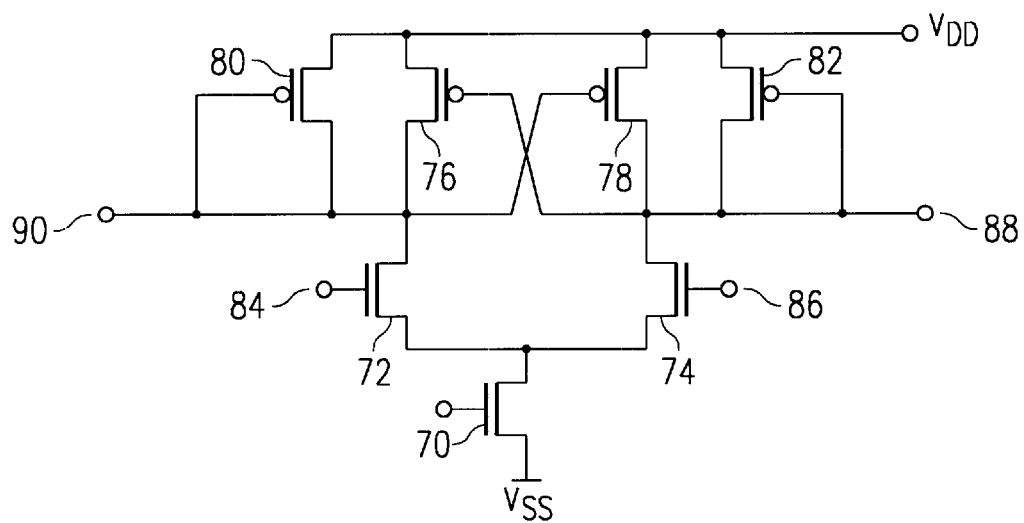
FIG. 3 is a schematic circuit diagram of a prior art small swing differential receiver.
Figure 4:
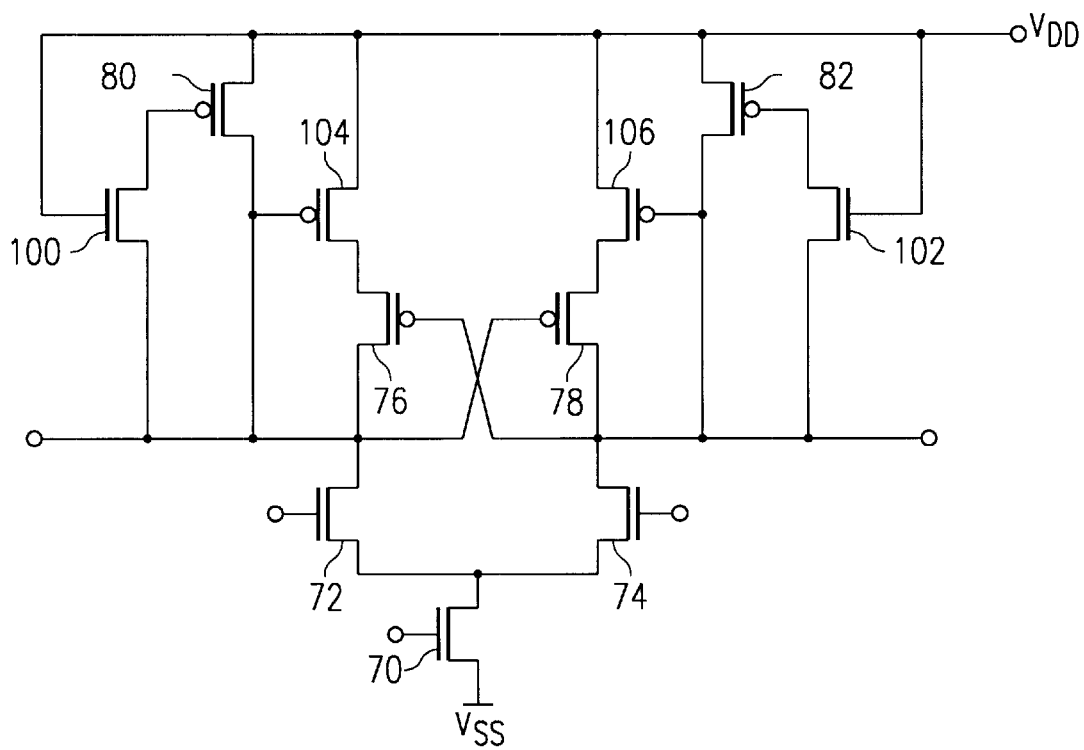
FIG. 4 is a schematic circuit diagram of a second preferred embodiment small swing differential receiver.

The circuits of FIGS. 1 and 2 operate with input voltages ranging from VSS to some voltage close to VDD. The prior art circuit of FIG. 3 and the second preferred embodiment circuit shown in FIG. 4 operate with input voltages ranging from VDD to some voltage close to VSS. The prior art circuit of FIG. 3 is the same as the prior art circuit of FIG. 1 except that the P-channel transistors 20, 22, and 24 have been replaced by N-channel transistors 70, 72, and 74, N-channel transistors 26, 28, 30, and 32 have been replaced by P-channel transistors 76, 78, 80, and 82, and VDD and VSS have been reversed. The second preferred embodiment circuit of FIG. 4 operates the same as the circuit of FIG. 2 except that P-channel transistors 20, 22, 24, 50, and 52 have been replaced with N-channel transistors 70, 72, 74, 100, and 102, N-channel transistors 26, 28, 30, 32, 54, and 56 have been replaced with P-channel transistors 76, 78, 80, 82, 104 and 106, and the voltages VSS and VDD have been reversed.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A differential receiver circuit comprising:

a current source;

a differential pair coupled to the current source;

a first transistor coupled to a first branch of the differential pair;

a second transistor coupled to a second branch of the differential pair, the first and second transistors are cross coupled;

a third transistor coupled in series with the first transistor;

a fourth transistor coupled in series with the second transistor;

a fifth transistor coupled in parallel with the first and third transistors;

a sixth transistor coupled in parallel with the second and fourth transistors;

a seventh transistor coupled between a control node of the fifth transistor and the first branch of the differential pair; and an eighth transistor coupled between a control node of the sixth transistor and the second branch of the differential pair, wherein the current source is a PMOS transistor, the differential pair has two PMOS transistors, the first, second, third, fourth, fifth, and sixth transistors are NMOS transistors, and the seventh and eighth transistors are PMOS transistors.

2. A differential receiver circuit comprising:

a current source;

a first differential transistor coupled to the current source;

a second differential transistor coupled to the current source;

a first transistor coupled to the first differential transistor;

a second transistor coupled to the second differential transistor, the first and second transistors are cross coupled;

a third transistor coupled in series with the first transistor;

a fourth transistor coupled in series with the second transistor;

a fifth transistor coupled in parallel with the first and third transistors;

a sixth transistor coupled in parallel with the second and fourth transistors;

a seventh transistor coupled between a control node of the fifth transistor and the first differential transistor; and an eighth transistor coupled between a control node of the sixth transistor and the second differential transistor, wherein the current source is a PMOS transistor, the first and second differential transistors are PMOS transistors, the first, second, third, fourth, fifth, and sixth transistors are NMOS transistors, and the seventh and eighth transistors are PMOS transistors.

3. A differential receiver circuit comprising:

a current source;

a differential pair coupled to the current source;

a first transistor coupled to a first branch of the differential pair;

a second transistor coupled to a second branch of the differential pair, the first and second transistors are cross coupled;

a third transistor coupled in series with the first transistor;

a fourth transistor coupled in series with the second transistor;

a fifth transistor coupled in parallel with the first and third transistors;

a sixth transistor coupled in parallel with the second and fourth transistors;

a seventh transistor coupled between a control node of the fifth transistor and the first branch of the differential pair; and an eighth transistor coupled between a control node of the sixth transistor and the second branch of the differential pair, wherein the current source is an NMOS transistor, the differential pair has two NMOS transistors, the first, second, third, fourth, fifth, and sixth transistors are PMOS transistors, and the seventh and eighth transistors are NMOS transistors.

4. A differential receiver circuit comprising:

a current source;

a first differential transistor coupled to the current source;

a second differential transistor coupled to the current source;

a first transistor coupled to the first differential transistor;

a second transistor coupled to the second differential transistor, the first and second transistors are cross coupled;

a third transistor coupled in series with the first transistor;

a fourth transistor coupled in series with the second transistor;

a fifth transistor coupled in parallel with the first and third transistors;

a sixth transistor coupled in parallel with the second and fourth transistors;

a seventh transistor coupled between a control node of the fifth transistor and the first differential transistor; and an eighth transistor coupled between a control node of the sixth transistor and the second differential transistor, wherein the current source is an NMOS transistor, the first and second differential transistors are NMOS transistors, the first, second, third, fourth, fifth, and sixth transistors are PMOS transistors, and the seventh and eighth transistors are NMOS transistors.

* * * * *